United States Patent [19]
Konda et al.

[11] Patent Number: 5,362,984
[45] Date of Patent: Nov. 8, 1994

[54] SEMICONDUCTOR DEVICE WITH JUMPING WIRE

[75] Inventors: Masashi Konda; Toshio Yamamoto; Yoshiaki Emoto, all of Tokyo, Japan

[73] Assignee: Nippon Steel Corporation, Tokyo, Japan

[21] Appl. No.: 839,558

[22] Filed: Feb. 24, 1992

[30] Foreign Application Priority Data

Feb. 28, 1991 [JP] Japan .................... 3-059425

[51] Int. Cl.$^5$ .......................................... H01L 23/02
[52] U.S. Cl. .................... 257/666; 257/776; 257/787; 257/784
[58] Field of Search ............... 257/776, 668, 787, 666, 257/784

[56] References Cited

U.S. PATENT DOCUMENTS

| | | | |
|---|---|---|---|
| 3,971,062 | 7/1976 | Merkle | 257/776 |
| 4,691,225 | 9/1987 | Murakami et al. | 257/668 |
| 5,083,189 | 1/1992 | Sawaya | 257/685 |
| 5,245,215 | 9/1993 | Sawaya | 257/787 |

FOREIGN PATENT DOCUMENTS

59-54252  3/1984  Japan.
2249245  10/1990  Japan.

*Primary Examiner*—William Mintel
*Assistant Examiner*—Roy Potter
*Attorney, Agent, or Firm*—Pollock, Vande Sande & Priddy

[57] ABSTRACT

A semiconductor device is disclosed in which connection between electrodes of a semiconductor element and/or between a plurality of semiconductor elements can be made in one package to the utmost. More particularly, electrodes of two IC chips 12a and 12b are bonded to leader leads 16a and interconnection leads $16b_5$ patterned on a film. Connections of the interconnection leads $16b_1$ and $16b_2$ to $16b_4$ and $16b_3$ which are impossible by the leads, are made in such a manner that pads $24b_1$, $24b_4$ and $24b_2$, $24b_3$ formed on the interconnection leads are connected correspondingly by using bonding wires as jumping wires. After the connection, the IC chips, the leads and the bonding wires are resin-sealed over an overall region encompassed by a region 27.

21 Claims, 3 Drawing Sheets

SEMICONDUCTOR DEVICE WITH JUMPING WIRE

FILED OF THE INVENTION

The present invention relates to a semiconductor device in which a semiconductor element such as an IC (integrated circuit) chip is mounted on a film substrate and a substrate which is used for making such a semiconductor device.

BACKGROUND OF THE INVENTION

A TAB (tape automated bonding) technique is known as one of IC chip mounting techniques. In the TAB technique it is possible to form leads with many pins and narrow pitch as compared with the other mounting techniques, and high-speed automatic bonding is applicable to the IC chip with its face-up. Therefore, the TAB technique has especially been highlighted in recent years.

A TAB tape has a structure in which one or more IC chips can be mounted on each package on a film carrier including a film of synthetic resin such as polyimide and leads formed thereon. The leads include those which extend outside the package are to be connected to a mounting substrate and others which extend in the package for interconnection within one IC chip or interconnection among a plurality of IC chips. The bondings of those leads to the IC chip are usually made by a transfer bump system in which the leads and electrodes of the IC chip are bonded through pressing and heating with bumps preformed by transfer at end portions of the leads of the film carrier.

JP-A-(Sho)59-54252 discloses a plurality of IC chips mounted on one package. According to the disclosure, wirings are preformed on a TAB tape in order to accommodate two IC chips in one package. However, it is required that the IC chips to be accommodated in the package are designed so that no jumper wiring is required between the chips. In the case where cross wirings between IC chips are inevitable, it is impossible to make the wirings by use of only leads formed on the film carrier. In that case, it may be considered to form leads on opposite surfaces of the film, form through-holes in the film at predetermined positions, and make electrical connection between the leads on the opposite surfaces of the film through the through-holes. In a multi-pin, narrow-pitch TAB tape, however, this method involves problems since the formation of through-holes is difficult and the cost is increased. Therefore, in the conventional semiconductor device, it was necessary to make the cross wirings outside the package. A primary purpose of accommodation of a plurality of IC chips in one package is to save a space for an electronic circuit system. Accordingly, the provision of the cross wirings outside the package reduces the merit of accommodation of a plurality of IC chips in one package since a space occupied by the cross wirings is additionally required and this space is increased as the number of cross wirings becomes large. There are further problems including poor the outward appearance and the higher possibility of disconnection and/or short circuit occurring in the cross wirings, resulting in less reliability of an equipment in which the package is used.

The present invention has been made under the above circumstance and has an object to provide a semiconductor device in which connections between electrodes of each semiconductor element and between semiconductor elements are possible in one package and a substrate which is a part of the semiconductor device and used for assemblage of such a semiconductor device.

SUMMARY OF THE INVENTION

To attain the above object, a semiconductor device according to one aspect of the present invention comprises a semiconductor element having a multiplicity of terminals for electrical connection to an exterior, a substrate for mounting the semiconductor element thereon, a plurality of leads formed on the substrate and electrically connected to the terminals of the semiconductor element, respectively, and a jumping wire for making a cross wiring between predetermined leads. A surface of the jumping wire may be coated with an insulator. The semiconductor device may further comprise a resin layer for sealing the semiconductor elements and the jumping wires together. The substrate includes portions for mounting a plurality of such semiconductor elements thereon. The lead may be a copper-base lead covered by a metal plating. The metal plating may include a gold plating. The substrate may be made of polyimide.

To attain the above object, a semiconductor device according to another aspect of the present invention comprises a plurality of semiconductor elements each having a multiplicity of terminals for electrical connection to an exterior, a substrate for mounting the semiconductor elements thereon, a plurality of leads formed on the substrate and electrically connected to the terminals of the semiconductor elements, respectively, a jumping wire for making a cross wiring between predetermined leads, and a resin layer for sealing the jumping wire and the semiconductor elements together. A surface of the jumping wire may be coated with an insulator. The lead may be a copper-base lead covered by a metal plating. The metal plating may include a gold plating. The substrate may be made of polyimide.

To attain the above object, a semiconductor device according to a further aspect of the present invention comprises a plurality of semiconductor elements each having a multiplicity of terminals for electrical connection to an exterior, a substrate for mounting the semiconductor elements thereon, a plurality of leads formed on the substrate and electrically connected to the terminals of the semiconductor elements, respectively, a jumping wire for making a cross wiring between predetermined leads, a surface of the jumping wire being coated with an insulator, and a resin layer for sealing the jumping wire and the semiconductor elements together. The lead may be a copper-base lead covered by a metal plating. The metal plating may include a gold plating. The substrate may be made of polyimide.

To attain the above object, a substrate according to a still further aspect of the present invention comprises a substrate film for mounting thereon a plurality of semiconductor elements having a multiplicity of terminals for electrical connection to an exterior, a plurality of leads formed on the substrate to be connected to the terminals of the semiconductor elements, respectively, and terminals provided to select leads to be connected to a jumping wire for cross wiring between predetermined ones of the leads. The lead may be a copper-base lead covered by a metal plating. The substrate may be made of polyimide.

According to the above construction of the present invention, in the case where interconnections among electrodes of one semiconductor element or among a plurality of semiconductor elements in a package of a semiconductor device are impossible by using leads formed on a substrate film carrier, for example, where the wirings of interconnections are crossing, the interconnections are made three-dimensionally by using electrically conductive wires thereby making possible cross wirings in one package, which could not be realized in the conventional device.

Also, by coating the surface of the wire with an insulator, it is possible to prevent a short circuit between the wire and the lead and/or between the wire and another wire.

DESCRIPTION OF THE PREFERRED EMBODIMENTS

A first embodiment of the present invention will now be explained with reference to FIGS. 1 and 2.

Figure 1:
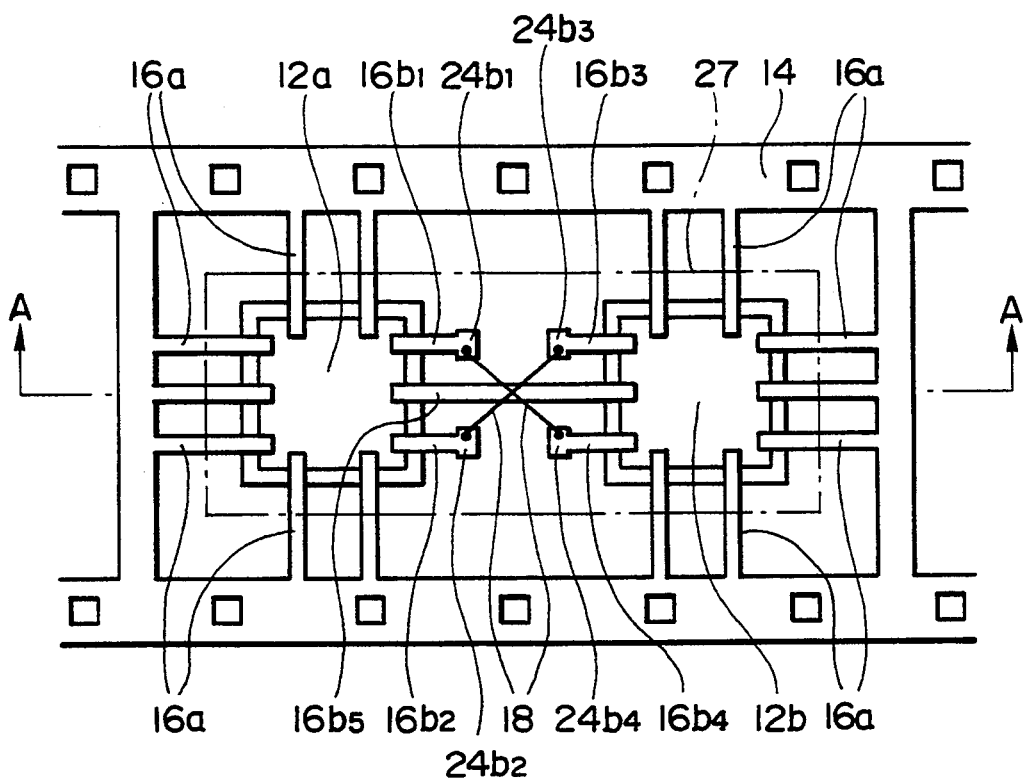
FIG. 1 is a schematic plan view of a semiconductor device according to a first embodiment of the present invention.
Figure 2:
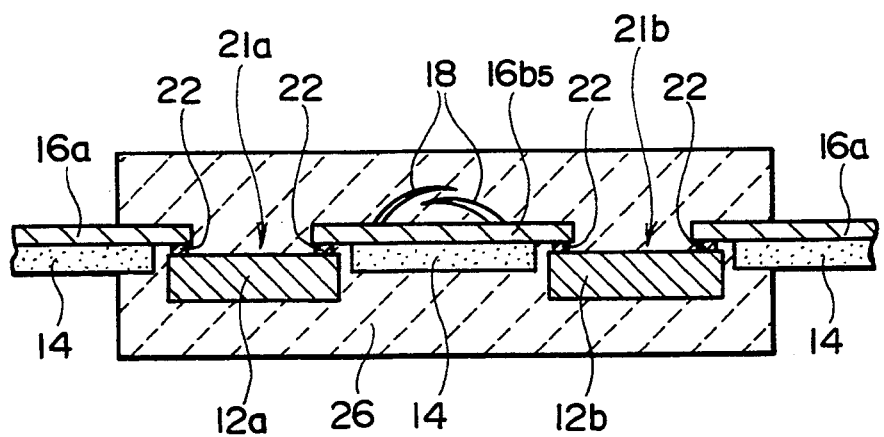
FIG. 2 is a schematic cross section taken along line A—A of the IC chips of the semiconductor device in FIG. 1 of the first embodiment as resin-sealed.

FIG. 1 is a schematic plan view of a semiconductor device according to the first embodiment of the present invention, and FIG. 2 is a schematic cross section taken along line A—A in FIG. 1 of which the IC chips mounted on a TAB tape are resin-sealed.

The semiconductor device shown in FIG. 1 includes two IC chips 12a and 12b, a film carrier (or a TAB tape) including a resin film 14 of polyimide having leads 16 which are formed of a pattern of copper on the film 14 covered by a plating of a metal such as gold, tin, solder or the like and bonding wires 18 coated with an insulator. Insulator-coated wires as disclosed in JP-A-(Hei)02-249245 are used as the bonding wires 18. Each of the IC chips 12a and 12b is formed in a substantially square shape and electrodes 22 are formed at the marginal portions of the surfaces of the IC chips. The film 14 has two device holes 21a and 21b provided correspondingly to mounting positions of the IC chips 12a and 12b, and outer lead holes (not shown). The device holes 21a and 21b are portions for mounting the IC chips 12a and 12b and are formed as openings. The outer lead holes are openings which serve as guides when the IC chips are punched out of the film 14. Polyimide having a high heat resistance and a high expansion/contraction resistance is used as the material of the film 14. A region 27 enclosed by one-dotted chain line in FIG. 1 is to be sealed by a resin 26.

The leads 16 include leader leads 16a which are extended out of a package for connection to a mounting substrate and interconnection leads which extend in the package for connection between the IC chips 12a and 12b. One end of each lead 16 is formed so as to project into the device hole 21a or 21b. The leader leads 16a and a part of the interconnection leads 16b have pads 24 on their extensions. The pads of the leader leads 16a (not shown in FIG. 1) are test pads for electrical test of the IC chip. The pads $24b_1$ to $24b_4$ of the interconnection leads $16b_1$ to $16b_4$ are provided for connection to bonding wires 18. Opposite ends of the interconnection lead $16b_5$ are connected to the IC chips 12a and 12b, respectively.

In this semiconductor device according to the first embodiment, the leads 16 of the TAB tape and the electrodes 22 of the IC chips 12a and 12b are bonded together by a so-called transfer bump system in which the leads 16a and 16b of the film carrier and the electrodes 22 of the IC chips 12a and 12b are bonded together by pressing and heating after bumps (not shown) have been transferred onto the end portions of the leads 16a and 16b of the film carrier. Also, in the TAB tape of the first embodiment, connections between the interconnection leads $16b_1$ and $16b_4$ and between interconnection leads $16b_2$ and $16b_3$ are required according to a design for wiring of the IC chips. Therefore, the bonding wires 18 are used to three-dimensionally connect the pads $24b_1$ and $24b_4$ and the pads $24b_2$ and $24b_3$, respectively.

FIG. 2, which is a cross section taken along line A—A in FIG. 1, shows a state in which the IC chips 12a and 12b bonded on the TAB tape as shown in FIG. 1 are sealed over the region 27 by the resin 26. The resin sealing makes it possible to maintain a high reliability without deteriorating the electrical characteristics of the fabricated semiconductor device.

As seen from the foregoing, in the semiconductor device of the present embodiment, a cross wiring in a package is possible in such a manner that two IC chips 12a and 12b are mounted on a film carrier (or TAB tape) 14 and interconnection between the IC chips 12a and 12b is made mainly by use of leads patterned on the film carrier while a cross connection, which is impossible by use of only the leads, is made by using a bonding wire, as mentioned above. Also, in the semiconductor device of the present embodiment, the connection by the bonding wire is made in a region which is hitherto resin-sealed. Therefore, even if three-dimensional connection using the bonding wire is made, such connection results in no increase in dimension of the semiconductor device. Accordingly, space saving can be achieved as compared with the conventional semiconductor device. Further, since an insulator-coated bonding wire as disclosed by JP-A-(Hei)02-249245 is used as the bonding wire 18, there is no possibility that the bonding wire 18 and the lead 16 (and the bonding wires 28) are short-circuited even if they contact each other.

Figure 3:
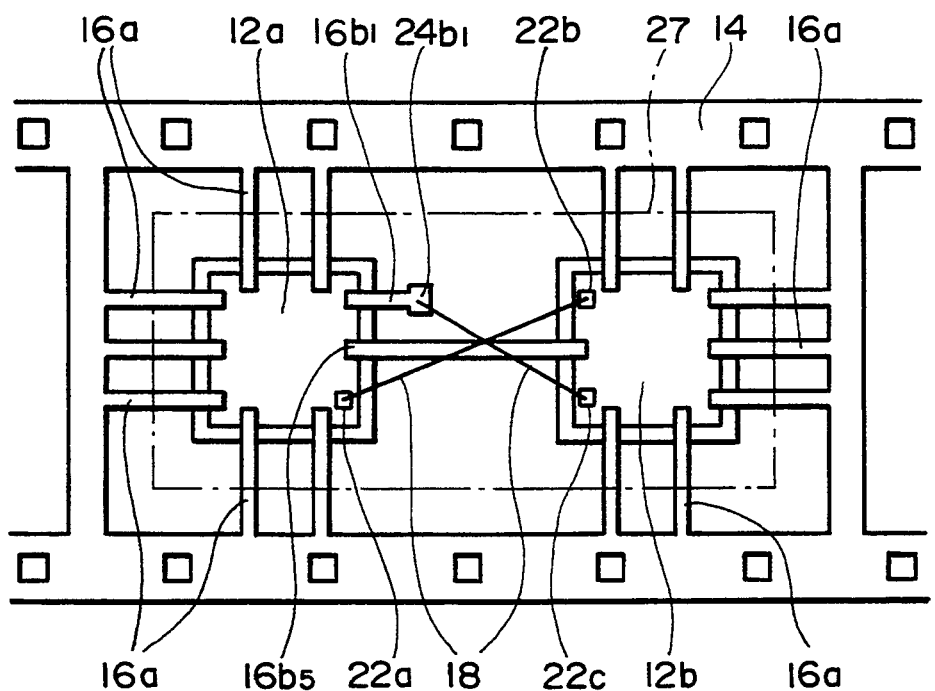
FIG. 3 is a schematic plan view of a semiconductor device according to a second embodiment of the present invention.

Next, a second embodiment of the present invention will be explained with reference to FIG. 3. FIG. 3 is a schematic plan view of a semiconductor device according to the second embodiment of the present invention. Since components or parts in the second embodiment having the same functions as those in the first embodiment are designated by the same reference numerals as those used in the first embodiment, detailed explanation thereof will be omitted.

The semiconductor device of the second embodiment in FIG. 3 is different from that of the first embodiment in that when IC chips 12a and 12b are interconnected, a pad $24b_1$ of an interconnection lead $16b_1$ is connected directly by a bonding wire 18. In the semiconductor device of the second embodiment, advantageous effects similar to those in the first embodiment can also be obtained.

Figure 4:
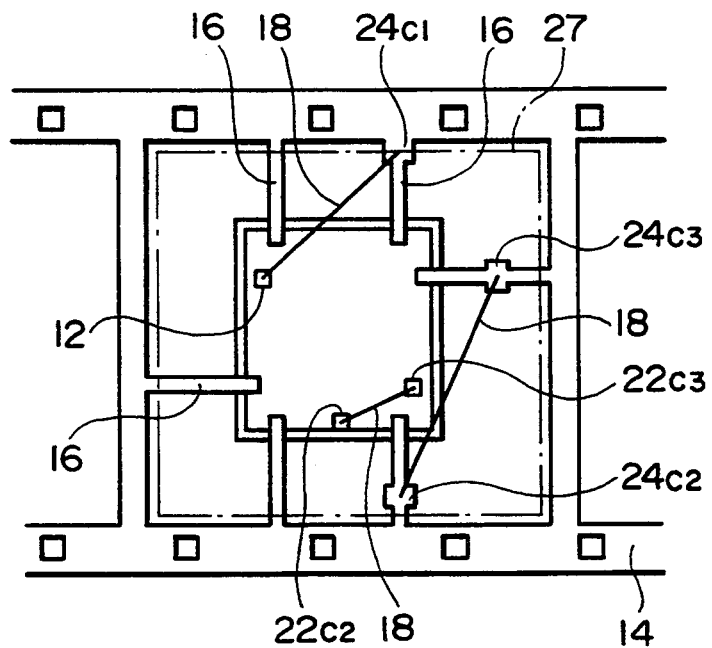
FIG. 4 is a schematic plan view of a semiconductor device according to a third embodiment of the present invention.

Next, a third embodiment of the present invention will be explained with reference to FIG. 4. FIG. 4 is a schematic plan view of a semiconductor device according to the third embodiment of the present invention. In the third embodiment, since components or parts having the same functions as those in the first embodiment are designated by the same reference numerals as those used in the first embodiment, detailed explanation thereof will be omitted.

The semiconductor device shown in FIG. 4 corresponds to one example of the case where one IC chip 12 is accommodated in a package and a cross wiring is required. A pad $24c_1$ of a lead 16 and an electrode $22c_1$ of the IC chip 12, electrodes $22c_2$ and $22c_3$ of the IC chip 12, and further a pad $24c_2$ of a lead 16 and a pad $24c_3$ of a lead 16 are three-dimensionally connected by bonding wires 18, respectively. In the semiconductor device of the third embodiment too, advantageous effects similar to those in the first embodiment can be obtained.

The above embodiments have been explained in conjunction with the case where one or two IC chips 12 are accommodated in one package of the film carrier 14. The present invention is not limited to such embodiments. Three or more IC chips may be accommodated in one package of the film carrier 14.

Figure 5:
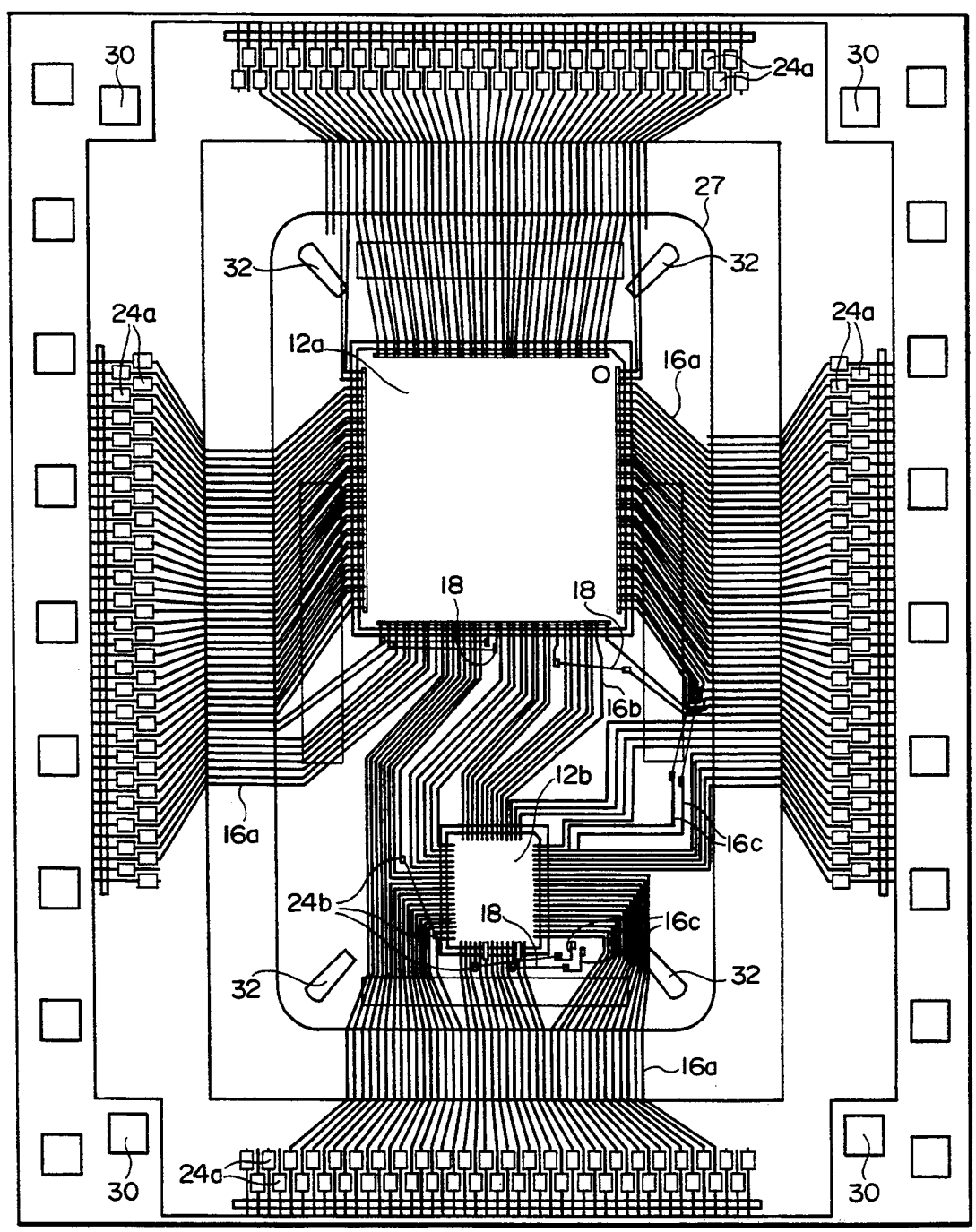
FIG. 5 is a plan view of a film carrier used for a semiconductor device according to a fourth embodiment of the present invention.

FIG. 5 shows a plan view of a TAB tape used for a semiconductor device according to a fourth embodiment of the present invention. Also in FIG. 5, since components or parts having the same functions as those in the first embodiment are designated by the same reference numerals as those used in the first embodiment, detailed explanation thereof will be omitted. A pattern shown in FIG. 5 is one of TAB tape patterns practically used. In FIG. 5, pads 24a (not shown in FIGS. 1 to 4) of leader leads 16a are shown such that they are arranged in two lines on each of four sides. Further, punched openings 32 are provided in a resin sealing region 27 of the TAB tape at four corners thereof in order to make a smooth flow of a resin from an upper side of the TAB tape 14 to a lower side thereof and vice versa. Also, outer lead holes 30 are provided at four corners of the TAB pattern. The outer lead holes 30 serve as marks when the semiconductor device is punched out of the TAB tape 14 after the IC chips 12a and 12b have been resin-sealed in the region 27. Though the pattern of leads on the TAB tape 14 is complicated as compared with the other drawings, there is basically no substantial difference. In FIG. 5, however, by-pass leads 16c in addition to the leader leads 16a and the interconnection leads 16b are provided at predetermined positions in order to perform more efficiently jumping wiring by bonding wires 18.

We claim:

1. A semiconductor device comprising:
   a plurality of semiconductor elements each having a plurality of terminals formed on one surface of a respective element;
   a substrate film for mounting said semiconductor elements thereon;
   a plurality of leads formed on said substrate, each lead having a first and a second end, the first ends of said leads being electrically connected to the terminals of said semiconductor elements, respectively;
   at least one jumping wire having a first end which is connected to the second end of one of said leads and a second end which is connected to the second end of a different one of said leads; and
   a resin layer for sealing said jumping wire and said semiconductor elements together.

2. A semiconductor device according to claim 1, wherein a surface of said jumping wire is coated with an insulator.

3. A semiconductor device according to claim 1, wherein said leads are each being a copper-base lead covered by a metal plating.

4. A semiconductor device according to claim 3, wherein said metal plating is a gold plating.

5. A semiconductor device according to claim 1, wherein said substrate film is made of polyimide.

6. A semiconductor device comprising:
   a plurality of semiconductor elements each having a plurality of terminals formed on one surface of a respective element;
   a substrate film for mounting said semiconductor elements thereon;
   a plurality of leads formed on said substrate, each lead having a first and a second end, the first ends of said leads being electrically connected to the terminals of said semiconductor elements, respectively;
   at least one jumping wire having a first end which is connected to the second end of one of said leads and a second end which is connected to the second end of a different one of said leads, a surface of said jumping wire being coated with an insulator; and
   a resin layer for sealing said jumping wire and said semiconductor elements together.

7. A semiconductor device according to claim 6, wherein said leads are each being a copper-base lead covered by a metal plating.

8. A semiconductor device according to claim 7, wherein said metal plating is a gold plating.

9. A semiconductor device according to claim 6, wherein said substrate film is made of polyimide.

10. A semiconductor device comprising:
    a base film;
    first and second mounting portions provided on the base film for mounting first and second semiconductor elements, respectively, each element having a plurality of terminals formed on a surface of the respective element;
    first leads formed on the base film, each lead having a first end which is connected to a selected first terminal of the first semiconductor element and a second end which is located outside of said first semiconductor element;
    second leads formed on the base film, each lead having a first end which is connected to a selected first terminal of the second semiconductor element and a second end which is located outside of said second semiconductor element;
    at least one third lead formed on the base film and having a first end which is connected to a selected second terminal of the first semiconductor element different from the selected first terminal thereof and a second free end;
    and at least one fourth lead formed on the base film and having a first end which is connected to a selected second terminal of the second semiconductor element different from the selected first terminal thereof and a second free end.

11. A semiconductor device according to claim 10, further comprising:

at least one fifth lead formed on the base film and having a first end which is connected to a selected third terminal of the first semiconductor element different from any of the selected first and second terminals and a second end which is connected to a selected third terminal of the second semiconductor element different from any of the selected first and second terminals of the second semiconductor element.

12. A semiconductor device according to claim 10, further comprising at least one sixth lead which is formed on said base film and electrically free.

13. A semiconductor device according to claim 12, further comprising:
at least one conductive wire electrically connected between the second end of the third lead and the second end of the fourth lead.

14. A semiconductor device according to claim 13, wherein said conductive wire is connected between the second end of the third lead and the second end of the fourth lead through said at least one sixth lead.

15. A semiconductor device according to claim 10, further comprising:
at least one conductive wire electrically connected between the second end of the third lead and the second end of the fourth lead.

16. A semiconductor device comprising:
a base film;
at least first and second mounting portions provided on the base film for mounting first and second semiconductor elements, respectively, each element having a plurality of terminals formed on a surface of the respective element;
first leads formed on the base film, each lead extending between a first end which is connected to a selected first terminal of the first semiconductor element and a second end which is located outside of said first semiconductor element;
second leads formed on the base film, each lead having a first end which is connected to a selected first terminal of the second semiconductor element and a second end which is located outside of said. second semiconductor element;
at least one third lead formed on the base film and having a first end which is connected to a selected second terminal of the first. semiconductor element different from the selected first terminal thereof and a second free end;
at least one fourth lead formed on the base film and having a first end which is connected to a selected second terminal of the second semiconductor element different from the selected first terminal thereof and a second free end; and
at least one conductive wire electrically connected between the second end of the third lead and the second end of the fourth lead.

17. A semiconductor device according to claim 16, further comprising:
at least one fifth lead formed on the base film and having a first end which is connected to a selected third terminal of the first semiconductor element different from any of the selected first and second terminals thereof and a second end which is connected to a selected third terminal of the second semiconductor element different from any said selected first and second terminals of the second semiconductor element.

18. A semiconductor device according to claim 16, further comprising:
at least one sixth lead which is electrically free.

19. A semiconductor device according to claim 18, wherein said conductive wire is connected between the second end of the third lead and the second end of the fourth lead through said at least one sixth lead.

20. A substrate for mounting at least two semiconductor elements comprising:
a base film formed with at least first and second mounting portions for mounting first and second semiconductor elements, respectively, each semiconductor element having a plurality of terminals formed on its one surface;
first leads formed on the base film, each lead having a first end which is to be connected to a selected first terminal of the first semiconductor element as mounted in the first mounting portion and second end which is located outside of said first mounting portion;
second leads formed on the base film, each lead having a first end which is to be connected to a selected first terminal of the second semiconductor element as mounted in the second mounting portion and a second end which is located outside of said second mounting portion;
at least one third lead formed on the base film and having a first end which is to be connected to a selected second terminal of the first semiconductor element as mounted in the first mounting portion different from the selected first terminal thereof and a second free end; and
at least one fourth lead formed on the base film and having a first end which is to be connected to a selected second terminal of the second semiconductor element as mounted in the second mounting portion different from the selected first terminal thereof and a second free end.

21. A substrate for mounting at least two semiconductor elements comprising:
a base film formed with at least first and second mounting portions for mounting first and second semiconductor elements, respectively, each semiconductor element having a plurality of terminals formed on its one surface;
first leads formed on the base film, each lead having a first end which is to be connected to a selected first terminal of the first semiconductor element as mounted in the first mounting portion and a second end which is located outside of said first mounting portion;
second leads formed on the base film, each lead having a first end which is to be connected to a selected first terminal of the second semiconductor element as mounted in the second mounting portion and a second end which is located outside of said second mounting portion;
at least one third lead formed on the base film and having a first end which is to be connected to a selected second terminal of the first semiconductor element as mounted in the first mounting portion different from the selected first terminal thereof and a second free end;
at least one fourth lead formed on the base film and having a first end which is to be connected to a selected second terminal of the second semiconductor element as mounted in the second mounting portion different from the selected first terminal thereof and a second free end; and
at least one conductive wire electrically connected between the second end of the third lead and the second end of the fourth lead.

* * * * *